(12) United States Patent
Alptekin et al.

(10) Patent No.: US 10,381,480 B2
(45) Date of Patent: Aug. 13, 2019

(54) RELIABLE GATE CONTACTS OVER ACTIVE AREAS

(71) Applicant: International Busniess Machines Corporation, Armonk, NY (US)

(72) Inventors: Emre Alptekin, Wappingers Falls, NY (US); Albert M. Chu, Nashua, NH (US); Eric Eastman, Lagrangeville, NY (US); Myung-Hee Na, Lagrangeville, NY (US); Ravikumar Ramachandran, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/716,705

(22) Filed: Sep. 27, 2017

(65) Prior Publication Data
US 2019/0097016 A1 Mar. 28, 2019

(51) Int. Cl.
| | | |
|---|---|---|
| H01L 29/78 | (2006.01) | |
| H01L 21/8234 | (2006.01) | |
| H01L 21/285 | (2006.01) | |
| H01L 29/66 | (2006.01) | |

(52) U.S. Cl.
CPC ...... H01L 29/785 (2013.01); H01L 21/28518 (2013.01); H01L 21/823431 (2013.01); H01L 29/66795 (2013.01); H01L 29/7845 (2013.01); H01L 2029/7858 (2013.01)

(58) Field of Classification Search
CPC ....... H01L 21/28518; H01L 21/823431; H01L 21/823821; H01L 29/41791; H01L 29/4933; H01L 29/66795; H01L 29/785; H01L 29/7851; H01L 2029/7858
See application file for complete search history.

(56) References Cited

U.S. PATENT DOCUMENTS

| | | | |
|---|---|---|---|
| 8,134,198 B2 | 3/2012 | Kamigaichi et al. | |
| 8,344,441 B2 | 1/2013 | Nishihara | |
| 2013/0320456 A1 | 12/2013 | Golonzka et al. | |
| 2014/0077305 A1 | 3/2014 | Pethe et al. | |
| 2014/0308782 A1* | 10/2014 | Chan ...................... | C30B 25/04 438/197 |
| 2016/0133623 A1 | 5/2016 | Xie et al. | |
| 2016/0190263 A1 | 6/2016 | Xie et al. | |
| 2016/0359009 A1* | 12/2016 | Xie ..................... | H01L 29/4232 |
| 2016/0365424 A1* | 12/2016 | Basker ................. | H01L 29/665 |
| 2017/0054004 A1* | 2/2017 | Cheng ............... | H01L 29/66553 |
| 2017/0092764 A1* | 3/2017 | Xie .................... | H01L 29/42356 |

(Continued)

OTHER PUBLICATIONS

M. Carmona et al., "Study of Gate Contact Over Active Area," 29th Symposium on Microelectronics Technology and Devices (SBMicro), Sep. 1-5, 2014, 4 pages.

(Continued)

*Primary Examiner* — Stephen W Smoot
(74) *Attorney, Agent, or Firm* — Vazken Alexanian; Ryan, Mason & Lewis, LLP

(57) ABSTRACT

A method for manufacturing a semiconductor device comprises forming a plurality of fins in an active region, forming a plurality of gates around the plurality of fins in the active region, forming one or more gate contacts in the active region, and forming a plurality of contacts to source/drain regions in the active region.

9 Claims, 22 Drawing Sheets

(56) References Cited

U.S. PATENT DOCUMENTS

2017/0125530 A1    5/2017  Zhang et al.
2018/0012887 A1*   1/2018  Labonte ............ H01L 21/31053

OTHER PUBLICATIONS

C.-S. Lee et al., "32-bit Processor Core at 5-nm Technology: Analysis of Transistor and Interconnect Impact on VLSI System Performance," IEEE International Electron Devices Meeting (IEDM), Dec. 3-7, 2016, 4 pages.
U.S. Appl. No. 15/412,608, filed Jan. 23, 2017.

* cited by examiner

100

300

300

300

300

300

300

300

300

300

400

500

600

700

RELIABLE GATE CONTACTS OVER ACTIVE AREAS

BACKGROUND

Given increased density and large-scale integration requiring more efficient use of area on a chip, device sizes are continuing to decrease. For example, devices are progressing toward the 7 nm node and beyond. Shrinking transistor sizes have led to aggressive scaling of pitches, such that device characteristics and performance are influenced by physical layout. For example, it has been recognized that advanced complementary metal oxide semiconductor (CMOS) scaling has been limited by middle-of-the-line (MOL) and back-end-of-the-line (BEOL) interconnects.

Although technology scaling is increasingly smaller, chip sizes are not being reduced with the same functionality due to restricted layout styles. For example, gate contacts (CBs or CB contacts) over active regions/areas (RXs), which can result in electrical shorts between gate and contacts to source/drain regions ("diffusion contacts" or "trench silicide (TS) contacts"), are not being used since such a layout can result in decreased contact reliability.

There is a need, therefore, for improved contact layout in an integration scheme which enables chip area scaling while maintaining functionality.

SUMMARY

Illustrative embodiments of the invention provide a semiconductor device including gate contacts (CBs) over an active area (RX), and techniques for fabricating the same.

According to an exemplary embodiment of the present invention, a semiconductor device comprises a plurality of fins, a plurality of gates formed around the plurality of fins, and an active region comprising a number of the plurality of fins, and one or more gate contacts.

According to an exemplary embodiment of the present invention, a method for manufacturing a semiconductor device comprises forming a plurality of fins in an active region, forming a plurality of gates around the plurality of fins in the active region, forming one or more gate contacts in the active region, and forming a plurality of contacts to source/drain regions in the active region.

According to an exemplary embodiment of the present invention, a method for manufacturing a semiconductor device comprises forming a plurality of fins in an active region, forming respective epitaxial regions on the plurality of fins, forming one or more gate contacts in the active region, and forming a trench silicide contact in the active region on the respective epitaxial regions of less than a number of the plurality of fins.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
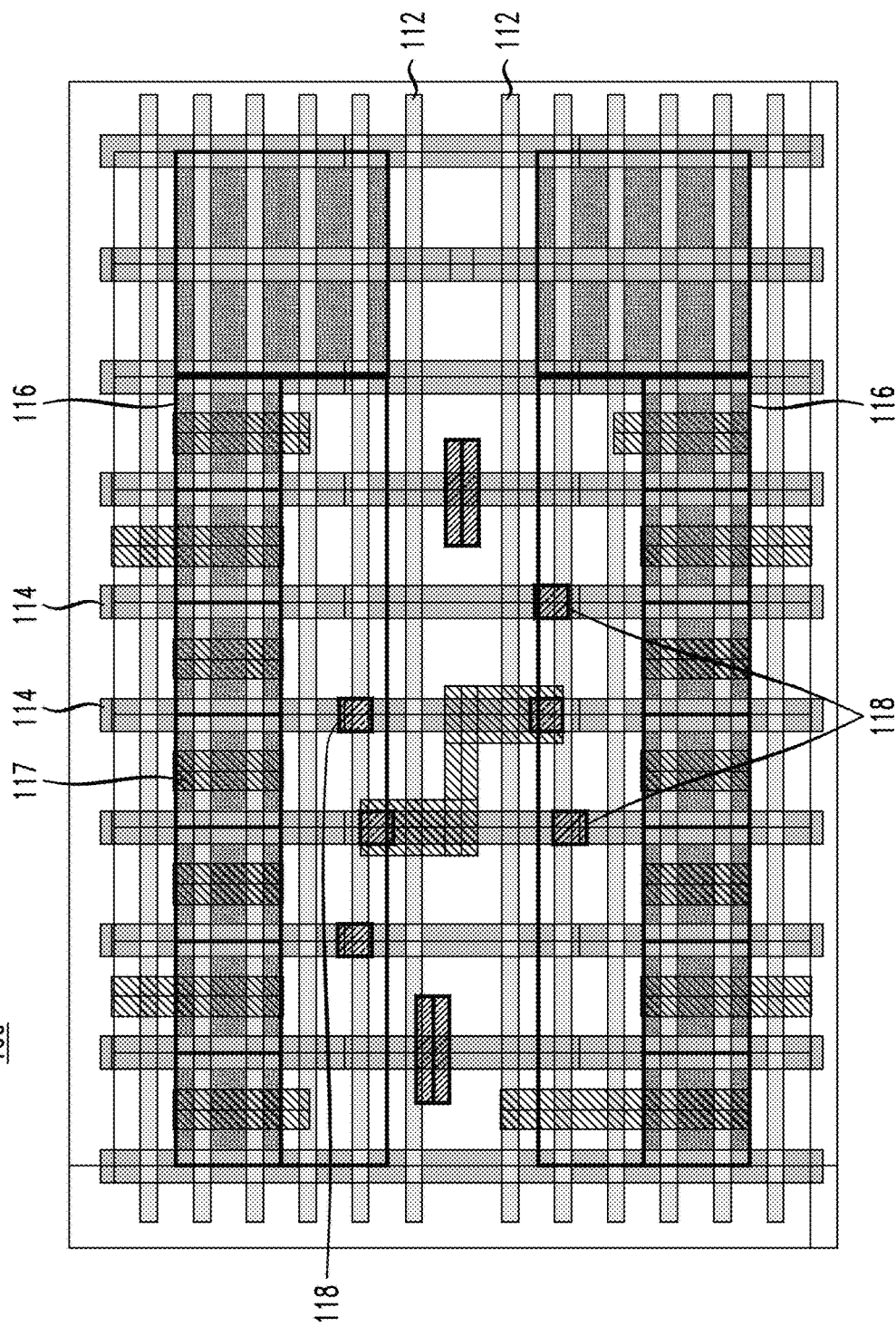
FIGS. 1 and 2 are top layout views of at least a portion of a cell illustrating gate contacts (CBs) over active regions (RXs), according to embodiments of the invention.

In illustrative embodiments, a semiconductor device including gate contacts (CBs) over an active area (RX) is provided. More particularly, illustrative embodiments relate to an integration scheme of CB over RX to further enable chip area scaling in CMOS or other semiconductor device technology. In accordance with an embodiment of the present invention, a relatively small CB contact surrounded by an inner spacer results in a reliable CB contact on an active area. In accordance with an embodiment of the present invention, an active area (RX) can be expanded to increase the fin count (e.g., from 2 fins to 4 fins) when compared with conventional designs. As a result, cell height can be reduced and MOL and BEOL reliability margins (e.g., CB to trench silicide (TS) reliability) can be maintained. A cell can include multiple transistors that are interconnected to implement desired logic functions, such as AND, OR, NOT, XOR, and XNOR, as well devices to implement storage functions (e.g., flip-flops, latches, and buffers).

Fin field-effect transistor (FinFET) devices include channels (e.g., fin channels) with source/drain regions at ends of the channels on sides of the channel regions. Current runs through the channels for example, from one source/drain region on one side of the channel to another source/drain region on another side of the channel.

It is to be understood that embodiments discussed herein are not limited to the particular materials, features, and processing steps shown and described herein. In particular, with respect to fabrication (forming or processing) steps, it is to be emphasized that the descriptions provided herein are not intended to encompass all of the steps that may be used to form a functional integrated circuit device. Rather, certain steps that are commonly used in fabricating such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount.

In the figures, the illustrated scale of one layer, structure, and/or region relative to another layer, structure, and/or region is not necessarily intended to represent actual scale. One or more layers and/or regions of a type commonly used in, for example, a complementary metal-oxide semiconductor (CMOS), nanowire FET, fin field-effect transistor (FinFET), metal-oxide-semiconductor field-effect transistor (MOSFET), vertical FET (VFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, MOSFETs, FinFETs, VFETs, and/or nanowire FETs. By way of non-limiting example, the semiconductor devices can include, but are not limited to CMOS, MOSFET, FinFET, VFET and/or nanowire FET devices, and/or semiconductor devices that use CMOS, MOSFET, FinFET, VFET and/or nanowire FET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the cross-sectional views measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Figure 2:
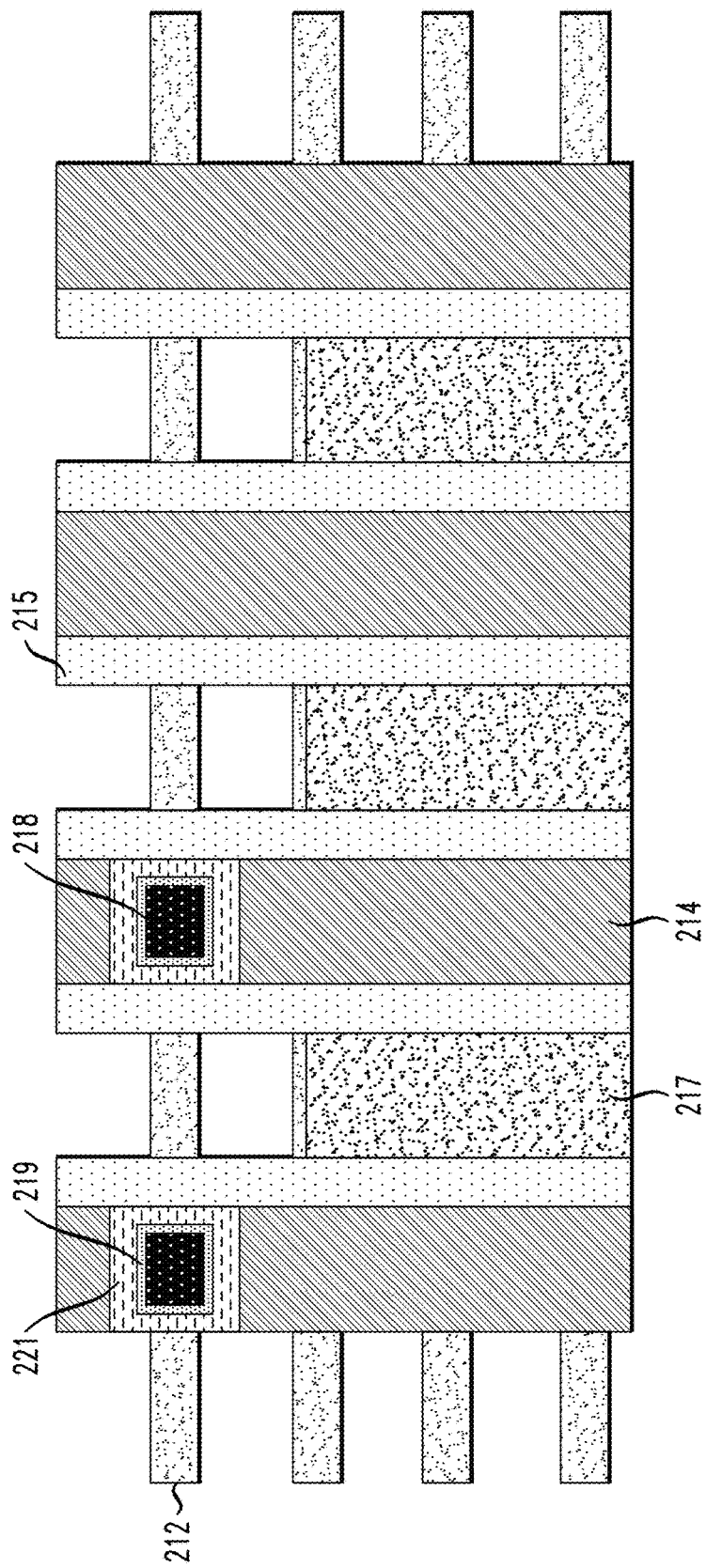

FIGS. 1 and 2 are top layout views of at least a portion of a cell illustrating gate contacts (CBs) over active regions (RXs), according to embodiments of the invention. Referring to FIG. 1, the schematic layout 100 illustrates a plurality of fins 112, a plurality of gates 114, and active regions 116 each including four fins 112 therein, as shown by the outlined rectangular portion. A plurality of gate contacts (CB contacts) 118 are positioned over gates 114 in the active regions 116. Performance advantages over conventional designs, including increased speed, are obtained by having an active region with more fins and CB contacts in the active regions. The active regions 116 further include electrical contacts 117 to source/drain regions (also referred to herein as "diffusion contacts" or "TS contacts"), which can include, but are not necessarily limited to, silicide or salicide contacts, for example, trench silicide or trench self-aligned silicide (salicide) contacts. As can be seen in FIG. 1, the contacts 117 are structured so that they do not extend to locations near or aligned with the CB contacts 118, so as to avoid electrical shorting with the CB contacts 118. As described further herein in connection with FIGS. 2 and 22, in accordance with an embodiment of the present invention, the contacts 117 are located a predetermined distance away from the CB contacts 118, and the CB contacts 118 include one or more dielectric spacers formed around the CB contacts 118 to encapsulate the CB contacts 118 and further prevent shorting between the CB contacts 118 and the contacts 117.

Referring to FIG. 2, the schematic layout 200 includes a plurality of fins 212 and a plurality of gates 214 in an active region. A plurality of gate contacts (CB contacts) 218 are positioned over the gates 214 in the active region. Contacts 217 to source/drain regions, like the contacts 117 are structured so that they do not extend to locations near or aligned with the CB contacts 218, so as to avoid electrical shorting with the CB contacts 218. In accordance with an embodiment of the present invention, the contacts 217 are located a predetermined distance away from the CB contacts 218, and the CB contacts 218 include dielectric spacers 219 and 221 formed around the CB contacts 218 to encapsulate the CB contacts 218 and further prevent shorting between the CB contacts 218 and the contacts 217. Gate spacers 215 are positioned on sides of the gates 214.

Figure 22:
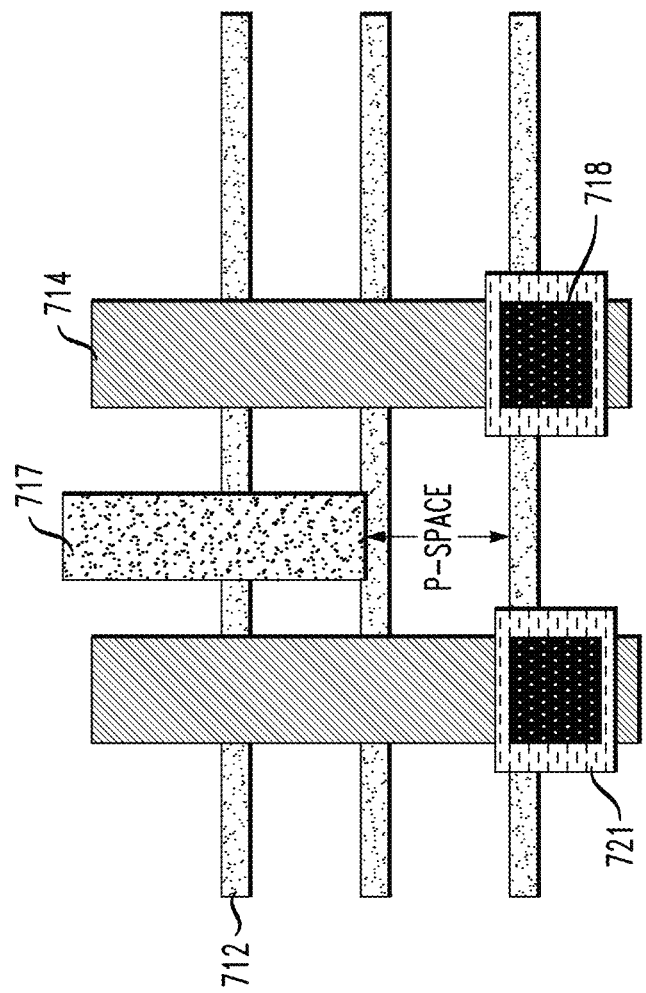
FIG. 22 is a top layout view of at least a portion of a cell illustrating gate contacts (CBs) in an active region (RX) and showing contact pull back where a fin is not strapped by a contact, according to an embodiment of the invention.

Referring to FIG. 22, like FIG. 2, the schematic layout 700 includes a plurality of fins 712 and a plurality of gates 714 in an active region. A plurality of gate contacts (CB contacts) 718 are positioned over the gates 714 in the active region. A contact 717 to source/drain regions, like the contacts 217, is structured so that it does not extend to locations near or aligned with the CB contacts 718, so as to avoid electrical shorting with the CB contacts 718. In accordance with an embodiment of the present invention, the contact 717 is located a predetermined distance away from the CB contacts 718 (P-space+diagonal distance between TS contact and CB contact provided by spacer(s)). The CB contacts 718 include a dielectric spacer 721 formed around the CB contacts 718 to encapsulate the CB contacts 718 and further prevent shorting between the CB contacts 718 and the contact 717. According to embodiments of the present invention, P-space of TS contacts can vary. By way of non-limiting illustrative example, if a spacer, like spacer 721, is 4 nm thick on a side, this would result in about 5.6 nm diagonal proximity to the diffusion contact (42+42~5.62). Assuming a design rule is 15 nm for distance between diffusion and CB contacts, then at P-space of 12 nm, and a spacer thickness of 4 nm, the design can pass a 3sigma standard deviation. When P-space is less than 11 nm (e.g., diffusion contact is overlapping with n−1 fin (where n is number of fins in active region)), the critical space becomes less than 15 nm, and may require thicker than a 4 nm spacer.

Figure 3:
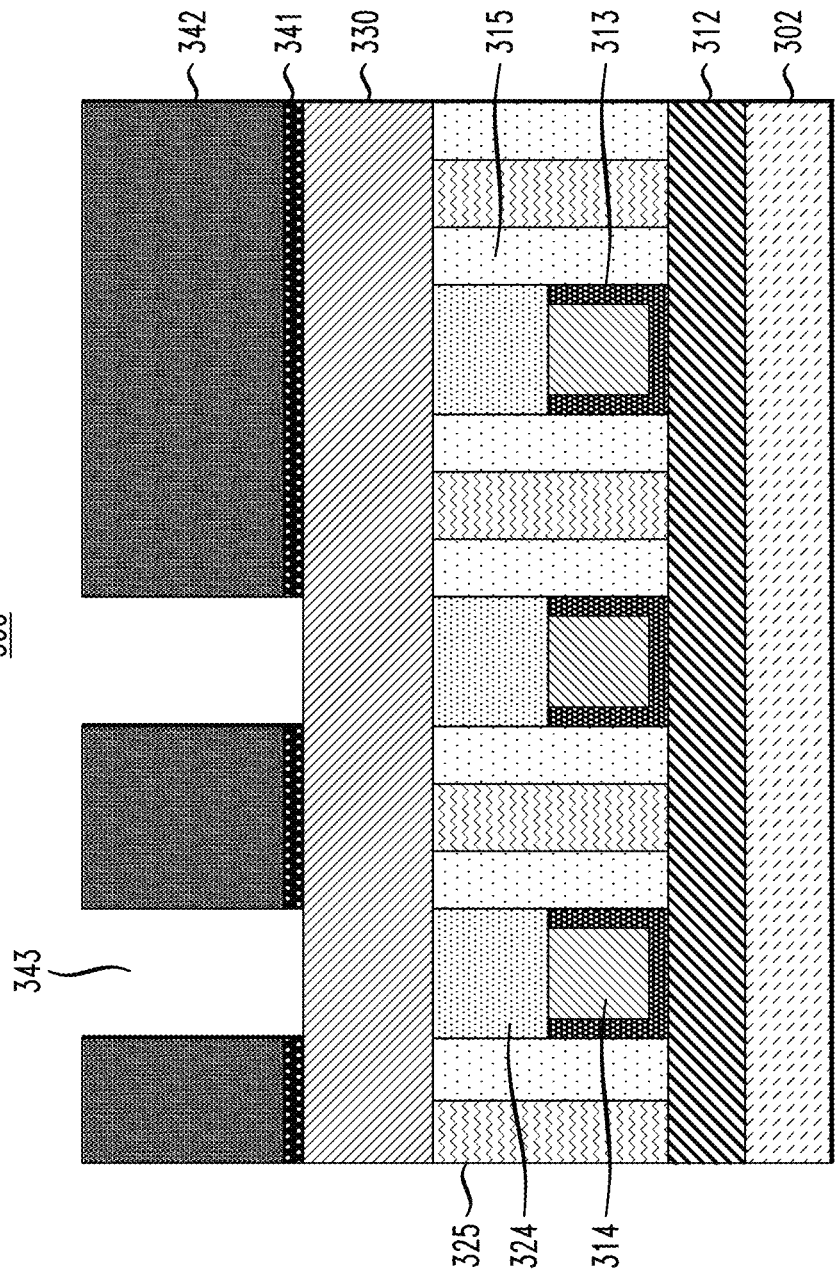
FIG. 3 is a schematic cross-sectional view illustrating manufacturing of a semiconductor device including gate contacts (CBs) over an active area (RX) and showing mask, resist and opening formation, according to an embodiment of the invention.

FIG. 3 is a schematic cross-sectional view illustrating manufacturing of a semiconductor device including gate contacts (CBs) over an active area (RX) and showing mask, resist and opening formation, according to an embodiment of the invention. For the purpose of clarity, illustration of some fabrication steps leading up to the production of the semiconductor structure 300 as illustrated in FIG. 3 have been omitted. FIGS. 3 to 17 are cross-sectional views taken perpendicular to a gate extension direction, while FIGS. 18 to 21 are cross-sectional views taken parallel to a gate extension direction.

Semiconductor structure 300 in FIG. 3 comprises a substrate 302. In one embodiment, a semiconductor substrate 302 includes semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), II-VI compound semiconductor or other like semiconductor. In addition, multiple layers of the semiconductor materials can be used as the semiconductor material of the substrate. The semiconductor substrate 302 can be a bulk substrate or a silicon-on-insulator (SOI) substrate including a buried insulating layer, such as, for example, a buried oxide or nitride layer.

In accordance with an embodiment of the present invention, as can be seen in FIG. 3, a fin 312 is formed on the substrate 302, using, for example, known methods of epitaxial growth and patterning.

As is known in the art, a fin of a FinFET can comprise, for example, silicon, and is a conducting channel that protrudes vertically from a substrate and extends in a direction from a source to a drain. As can be understood by one of ordinary skill in the art, a plurality of fins can be formed on the substrate 302 and spaced apart from each other at regular intervals along a gate extension direction. A plurality of gates can intersect the fins and extend perpendicular to the extension direction of the fins. Multiple gates can be spaced apart from each other along the extension direction of the fins.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and may be conducted at higher or lower temperatures as needed.

A number of different sources may be used for the epitaxial growth. For example, the sources may include precursor gas or gas mixture including for example, a silicon containing precursor gas (such as silane) and/or a germanium containing precursor gas (such as a germane). Carrier gases like hydrogen, nitrogen, helium and argon can be used.

A gate structure including, for example, dielectric layer 313, for example, a high-K dielectric layer, is formed on the fin 312 and on sides of gate spacers 315. The dielectric layer 313 can include, but is not limited to hafnium oxide, zirconium dioxide, hafnium zirconium oxide, aluminum oxide, titanium oxide, tantalum pentoxide, lanthanum oxide, strontium titanium oxide, lanthanum aluminum oxide, and mixtures thereof. Gate electrodes (also referred to herein as "gates") 314 are formed on the dielectric layers 313 using, for example, deposition techniques such as, for example, chemical vapor deposition (CVD), plasma enhanced CVD (PECVD), physical vapor deposition (PVD), atomic layer deposition (ALD), molecular beam deposition (MBD), pulsed laser deposition (PLD), liquid source misted chemical deposition (LSMCD), sputtering, and/or plating. The gate electrodes 314 may include gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof.

Gate spacers 315 are formed on sides of the gate structures including the dielectric layers 313 and gates 314. The gate spacers 315 isolate the gates 314 from the portions of the fin 312 contacting source/drain regions. The spacers 315 can include a dielectric insulating material such as, for example, silicon oxide, silicon nitride, silicon oxynitride, boron nitride, and/or silicon boron nitride. Adjacent the spacers 315 are conductive layers 325 to fins 312. As described further herein in connection with FIGS. 18, 20 and 21, the conductive layers 325 comprise epitaxial regions grown from fins 312. Diffusion contacts (e.g., trench silicide contacts) electrically connect to source/drain regions via the conductive layers 325. In accordance with an embodiment of the present invention, even if the epitaxial films grown from the fins 312 are not fully connected to each other by contact with each other (see, e.g., FIG. 20), silicides and a metallization layer (e.g., tungsten (W) and/or cobalt (Co)) will electrically strap the fins. If the fins 312 are connected by the epitaxial films through touching, then silicides will strap the fins (see, e.g., FIGS. 18 and 21). The conductive layers 325 include, but are not necessarily limited to, epitaxial regions that are respectively grown on each of a plurality of fins in source/drain regions. For example, silicon germanium and/or silicon is epitaxially grown on exposed surfaces, for example silicon surfaces, of the fins. As noted above, when the conductive layers 325 are contacting each other like in FIGS. 18 and 21, then a silicide formed on top of the conductive layers 325 electrically will strap the fins 312. However, if the conductive layers 325 are not touching like in FIG. 20, then you need metallization content over the source-drain regions to strap the fins 312.

A cap layer 324 is formed on each of the gates 314. According to an embodiment, a height of the cap layer (e.g., vertical thickness) is about 30 nm, but is not necessarily limited thereto. The cap layer 324 can include, but is not necessarily limited to, amorphous carbon (a-C), or a combination of a-C and a nitride, such as SiN, SiON, SiOCN, or SiBCN. Cap layers 324 where CB contacts are not to be formed (e.g., cap layer 324 on gate on right side of FIG. 3) may include a nitride without a-C. The a-C cap layer is needed to pattern the CB contacts over active gates as an intermediate step.

A mask layer 330 including, for example, a dielectric, such as an oxide or nitride, is deposited on the spacer, cap, and conductive layers 315, 325 and 325. A resist 342 including a hard mask layer 341 is deposited on the mask layer 330. In accordance with an embodiment of the present invention, materials for layers 330, 341 and 342 can include a combination of SiO$_2$/SION/SIN/aC/Si-containing anti-reflective coatings (ARC) or other dielectric combinations used to transfer a pattern into the mask. Openings 343 down to the mask layer 330 are formed in the resist 342 through the hard mask 341, using, for example, an etching process, such as, but not necessarily limited to, reactive ion etching (ME). The openings 343 correspond to at least some of the cap layers 324 and underlying gates 314.

Figure 4:
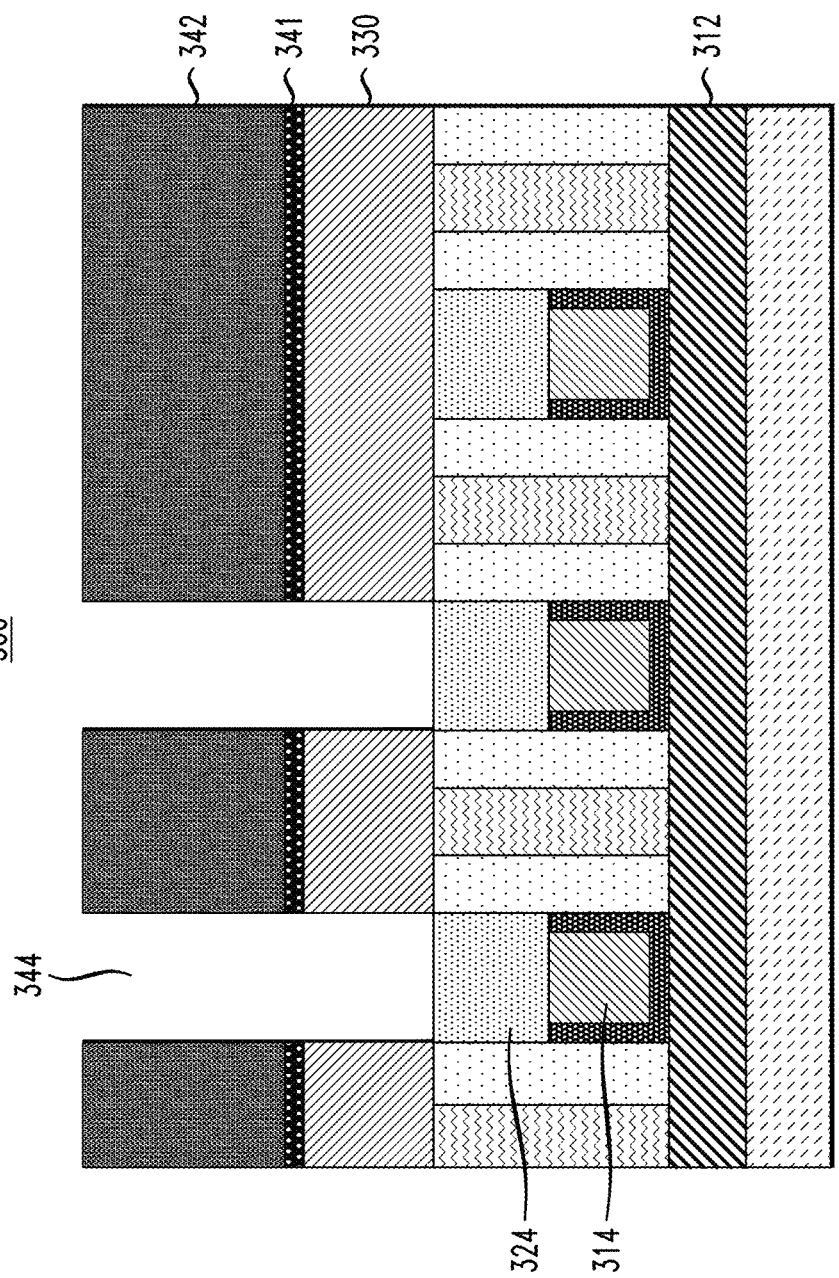
FIG. 4 is a schematic cross-sectional view illustrating manufacturing of a semiconductor device including gate contacts (CBs) over an active area (RX) and showing removal of portions of a mask layer to expose a cap layer, according to an embodiment of the invention.

FIG. 4 is a schematic cross-sectional view illustrating manufacturing of a semiconductor device including gate contacts (CBs) over an active area (RX) and showing removal of portions of a mask layer to expose a cap layer, according to an embodiment of the invention. Referring to FIG. 4, the portions of the mask layer 330 exposed by openings 343 are removed to form openings 344. The openings 344 are formed to expose at least some of the cap layers 324, using, for example, an etching process, such as, but not necessarily limited to, reactive ion etching (RIE).

Figure 5:
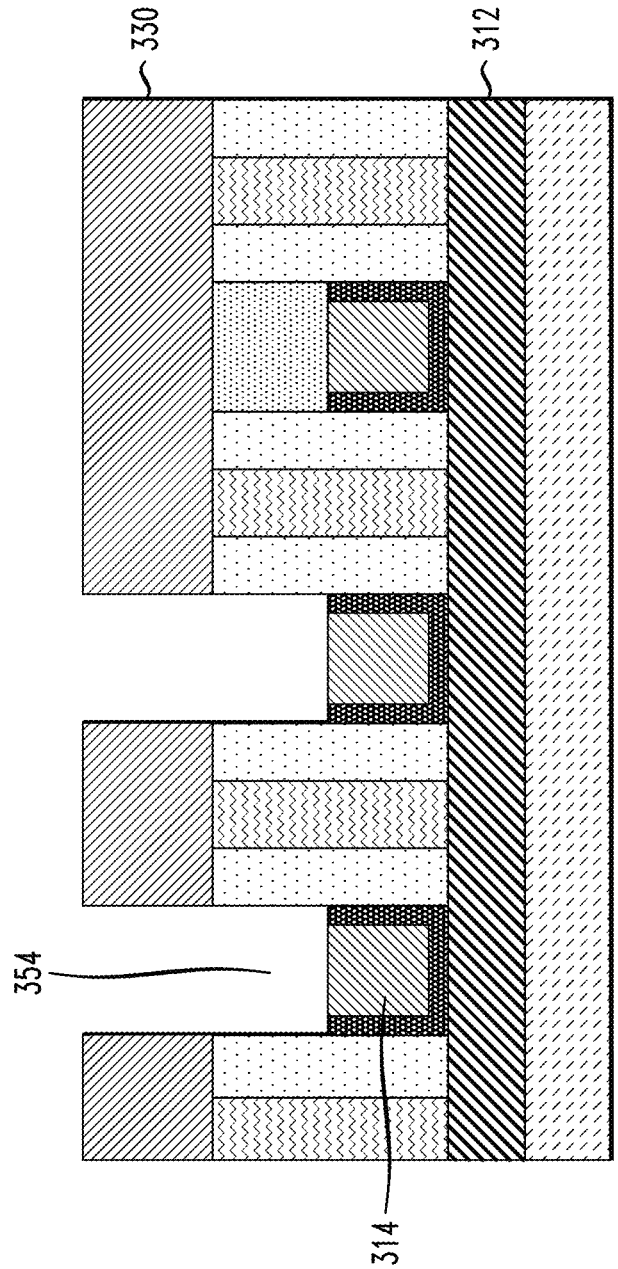
FIG. 5 is a schematic cross-sectional view illustrating manufacturing of a semiconductor device including gate contacts (CBs) over an active area (RX) and showing removal of exposed cap layers and portions of resist and mask layers, according to an embodiment of the invention.

FIG. 5 is a schematic cross-sectional view illustrating manufacturing of a semiconductor device including gate contacts (CBs) over an active area (RX) and showing removal of exposed cap layers and portions of resist and mask layers, according to an embodiment of the invention. Referring to FIG. 5, after formation of the openings 344, the resist 342 and hard mask 341 are stripped using, for example, ashing with $N_2/H_2$ based chemistry. Then, the exposed portions of the cap layers 324 are removed using for example, an etching process, such as, RIE and/or an ashing process. For example, in the case of a cap layer including a combination of a-C and a nitride, a nitride RIE followed by ashing of a-C is performed to remove the exposed cap layers 324 and form openings 354 exposing the underlying gates 314.

Figure 6:
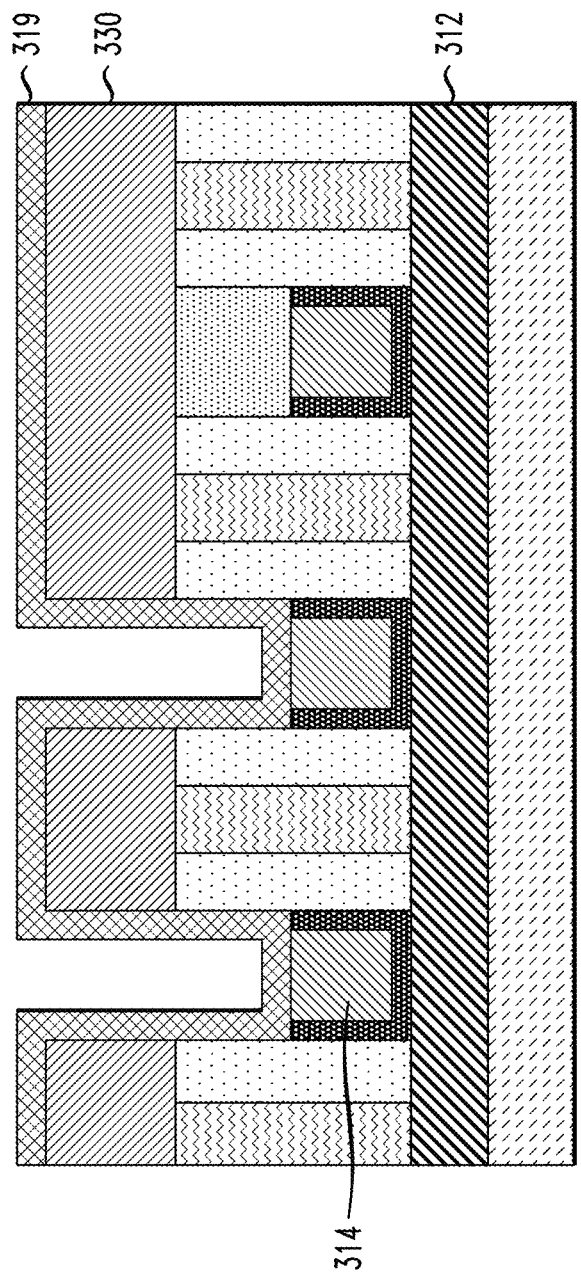
FIG. 6 is a schematic cross-sectional view illustrating manufacturing of a semiconductor device including gate contacts (CBs) over an active area (RX) and showing deposition of a first spacer layer, according to an embodiment of the invention.

FIG. 6 is a schematic cross-sectional view illustrating manufacturing of a semiconductor device including gate contacts (CBs) over an active area (RX) and showing deposition of a first spacer layer, according to an embodiment of the invention. Referring to FIG. 6, a first spacer layer 319 is deposited using deposition techniques, including, but not limited to, CVD, PECVD, PVD, ALD, MBD, PLD, and/or liquid LSMCD, followed by a spacer RIE to achieve a predetermined thickness of the spacer 319 on walls of the opening 354. In accordance with an embodiment of the present invention, the thickness of the spacer 319 is based on P-space calculations as discussed herein above and a CB to diffusion (e.g., trench silicide) contact reliability margin calculation so as to avoid shorting between CB and diffusion contacts. Factors affecting contact reliability margin calculation include, but are not necessarily limited to, gate length, gate dielectric thickness, gate spacer thickness, contacted poly pitch (CPP), CB contact to gate overlay, and/or critical dimension uniformity (CDU) for the CB contact.

The first spacer layer 319 can include, but is not necessarily limited to, a dielectric, such as silicon oxide, silicon nitride, silicon oxynitride, boron nitride, and/or silicon boron nitride. For example, in a non-limiting illustrative embodiment, a 6 nm SiN spacer layer can be deposited on mask layer 330 and conformally in openings 354 followed by RIE to result in a spacer 319 with a thickness of 5 nm on walls of opening 354.

Figure 7:
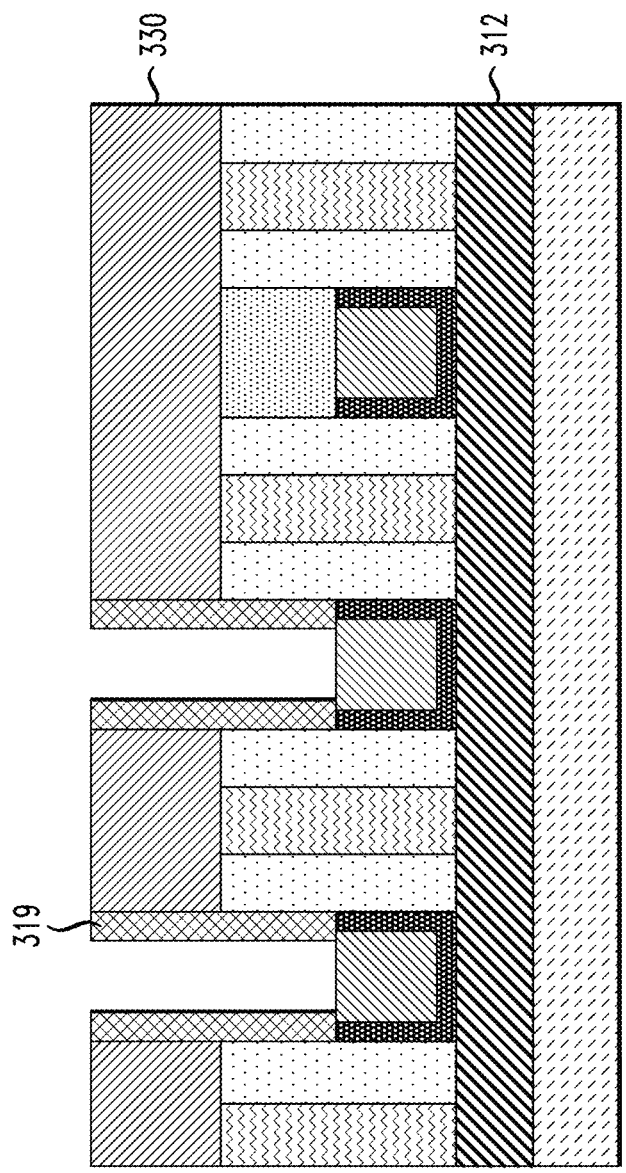
FIG. 7 is a schematic cross-sectional view illustrating manufacturing of a semiconductor device including gate contacts (CBs) over an active area (RX) and showing removal of portions of the first spacer layer, according to an embodiment of the invention.
Figure 8:
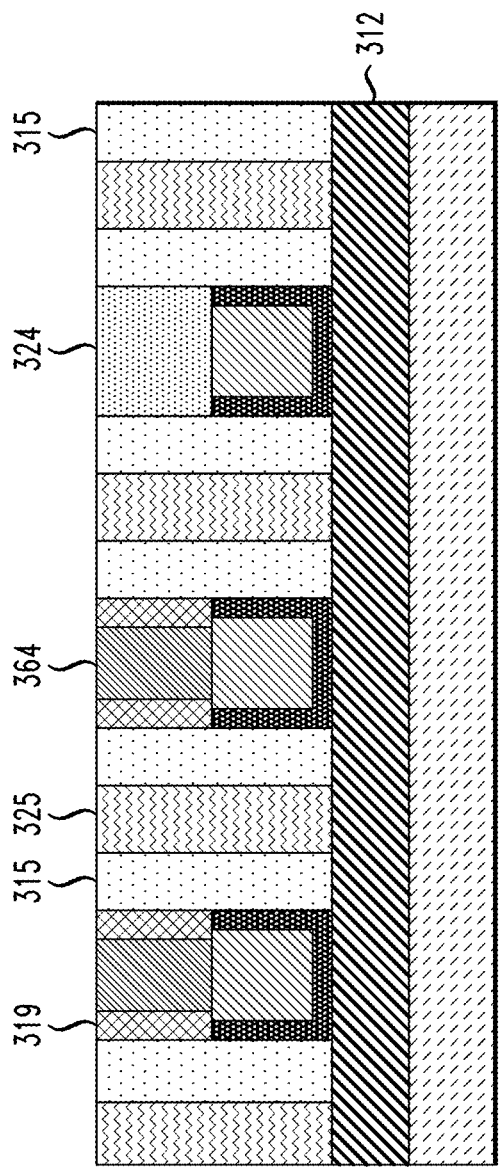
FIG. 8 is a schematic cross-sectional view illustrating manufacturing of a semiconductor device including gate contacts (CBs) over an active area (RX) and showing removal of a mask layer and deposition of a contact material, according to an embodiment of the invention.

FIG. 7 is a schematic cross-sectional view illustrating manufacturing of a semiconductor device including gate contacts (CBs) over an active area (RX) and showing removal of portions of the first spacer layer, according to an embodiment of the invention. Referring to FIG. 7, horizontal portions of the first spacer layer 319 on the mask layer 330 and on the gates 314 are removed during the formation of the sidewall spacer 319. Then, referring to FIG. 8, contact material, such as, for example, an electrically conductive material including, but not necessarily limited to, titanium, titanium nitride, tungsten, cobalt, ruthenium, copper, or combinations thereof, is deposited in openings 354 on remaining portions of the spacer layer 319 to form a lower gate contact 364 where the removed portion of the gate cap layer 324 was formed (referred to as "GC contact"). Deposition of the contact material can be performed using, for example, deposition techniques, CVD, PECVD, PVD, ALD, MBD, PLD, liquid LSMCD, sputtering and/or plating, followed by a planarization process, such as chemical mechanical polishing (CMP) down to the remaining cap layer 324, which removes excess contact material and the mask layer 330. The thickness of spacer 319 is determined to cover, at least in part, variations between GC contact to gate and CB contact to gate.

Figure 9:
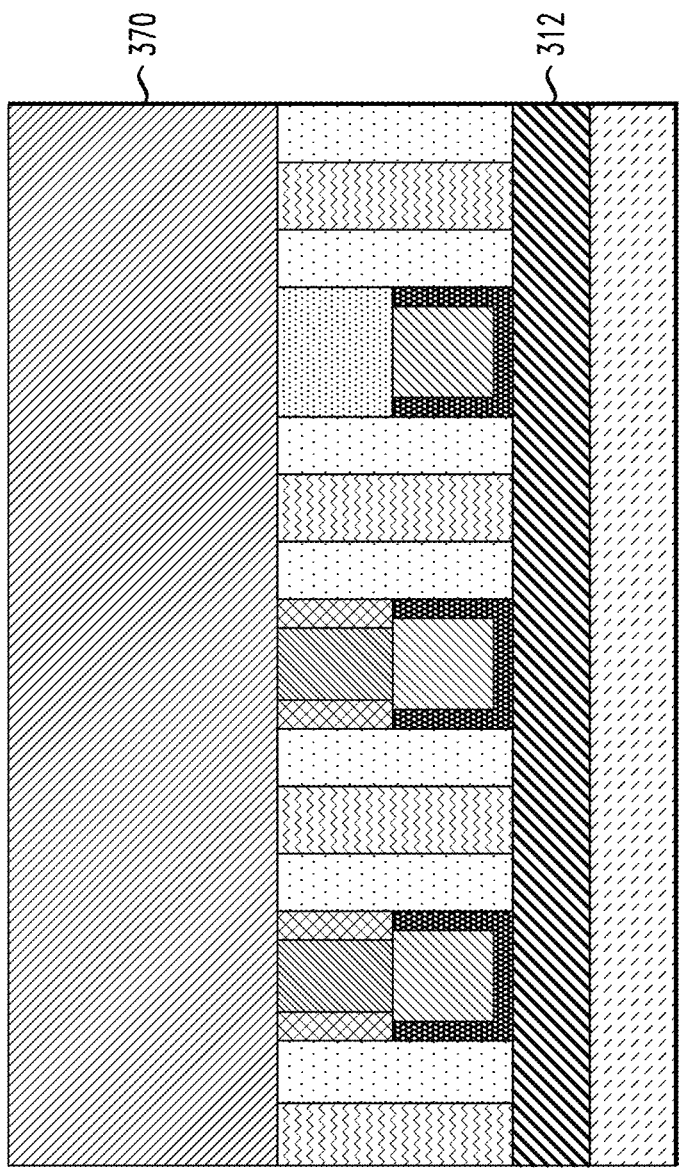
FIG. 9 is a schematic cross-sectional view illustrating manufacturing of a semiconductor device including gate contacts (CBs) over an active area (RX) and showing formation of an inter-layer dielectric (ILD) layer, according to an embodiment of the invention.

FIG. 9 is a schematic cross-sectional view illustrating manufacturing of a semiconductor device including gate contacts (CBs) over an active area (RX) and showing formation of an inter-layer dielectric (ILD) layer, according to an embodiment of the invention. Referring to FIG. 9, after removal of the excess contact material and the mask layer 330, an inter-layer dielectric (ILD) layer 370 is deposited on the structure from FIG. 8. The ILD layer 370 can be deposited using deposition techniques, including, but not limited to, CVD, PECVD, PVD, ALD, MBD, PLD, and/or liquid LSMCD. The ILD layer 370 can include, but is not necessarily limited to, silicon dioxide ($SiO_2$), low-temperature oxide (LTO), high-temperature oxide (HTO), field oxide (FOX) or some other dielectric.

Figure 10:
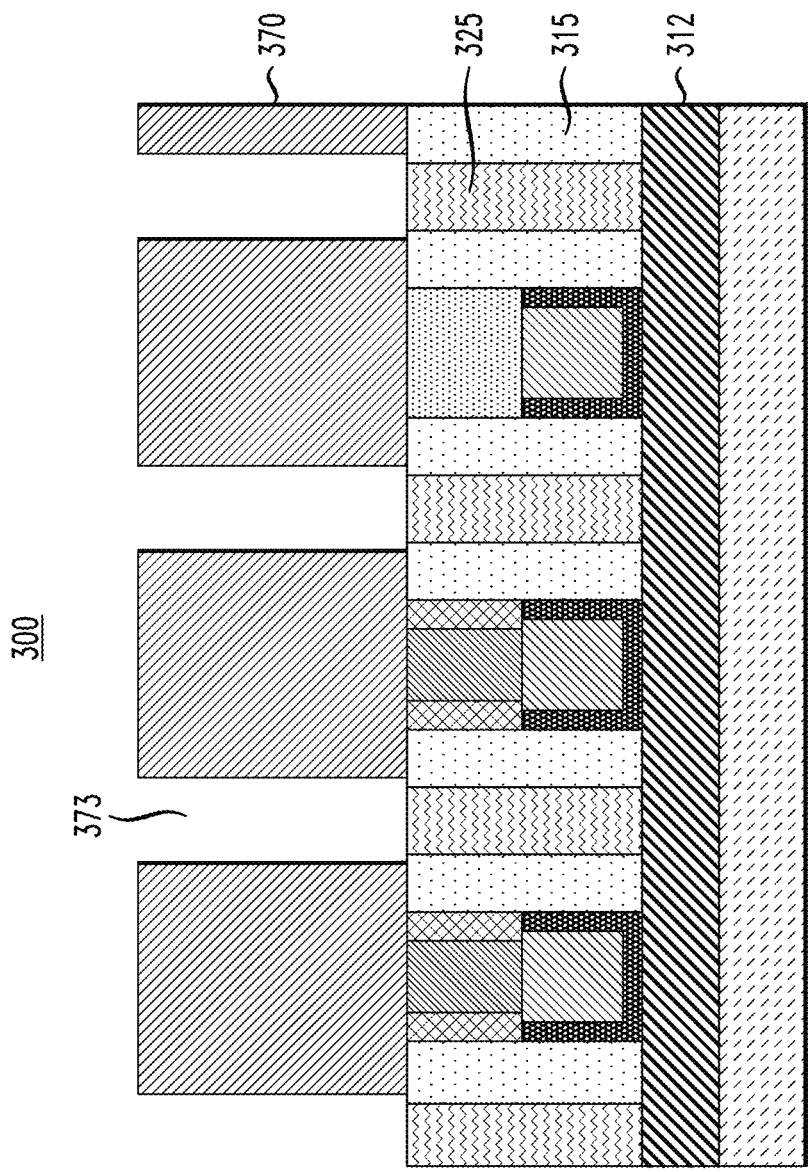
FIG. 10 is a schematic cross-sectional view illustrating manufacturing of a semiconductor device including gate contacts (CBs) over an active area (RX) and showing removal of portions of the ILD layer to expose contacts to a fin, according to an embodiment of the invention.

FIG. 10 is a schematic cross-sectional view illustrating manufacturing of a semiconductor device including gate contacts (CBs) over an active area (RX) and showing removal of portions of the ILD layer to expose contacts to the fin, according to an embodiment of the invention. Referring to FIG. 10, portions of the ILD layer 370 corresponding to the contacts 325 to the fin 312 are removed to form openings 373. The openings 373 expose the contacts 325 and may be wide enough to expose portions of the gate spacers 315. The openings 373 can be formed using an etching process, such as, but not necessarily limited to, reactive ion etching (RIE).

Figure 11:
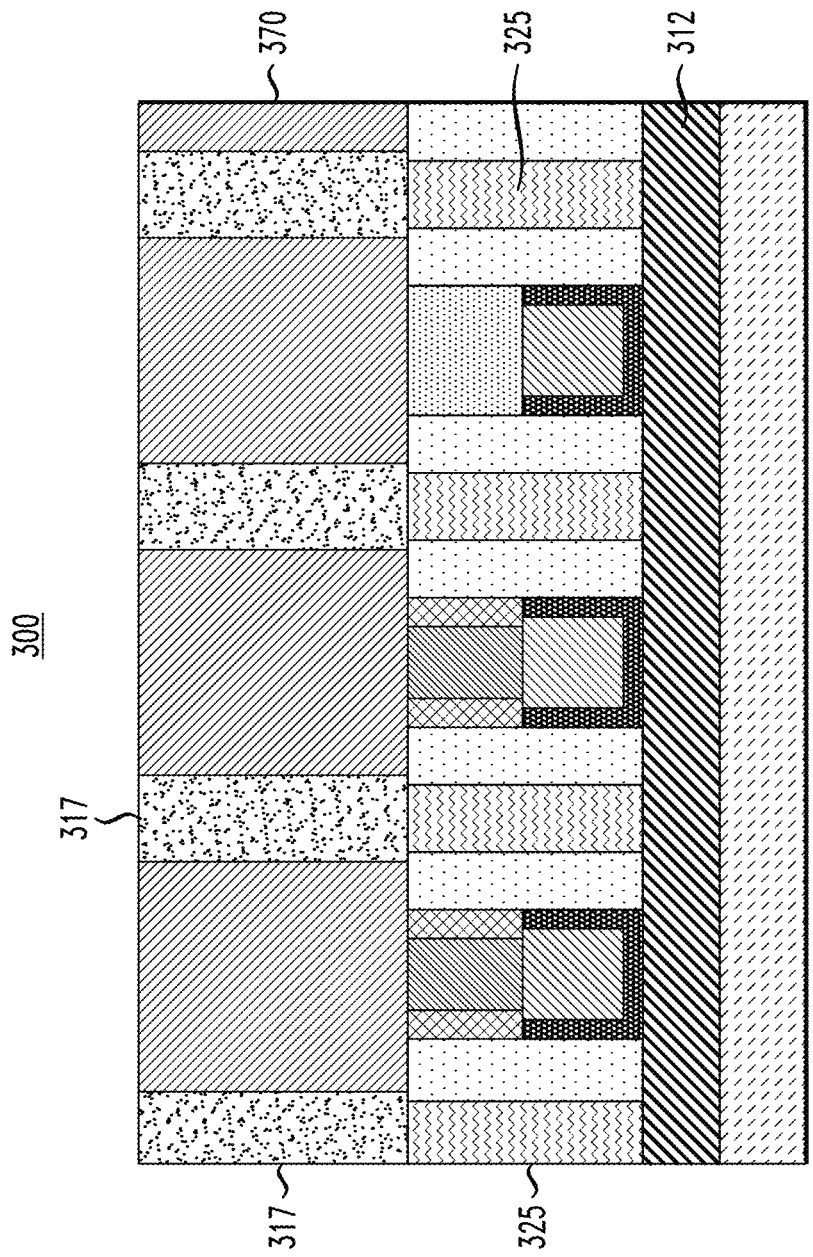
FIG. 11 is a schematic cross-sectional view illustrating manufacturing of a semiconductor device including gate contacts (CBs) over an active area (RX) and showing formation of trench silicide contacts, according to an embodiment of the invention.

FIG. 11 is a schematic cross-sectional view illustrating manufacturing of a semiconductor device including gate contacts (CBs) over an active area (RX) and showing formation of TS contacts, according to an embodiment of the invention. Referring to FIG. 11, TS contacts 317, including, for example, electrically conductive material such as, but not necessarily limited to, a metal to form the silicide is deposited in openings 373. The metal can include, but is not limited to, titanium, cobalt, tantalum, and nickel platinum. A CMP process can be used to remove the metal above dielectric layer 370. The contacts 317 may comprise a silicide, including, for example, nickel silicide (NiSi), nickel platinum silicide ($NiPt_ySi_x$), cobalt silicide ($CoSi_x$), tantalum silicide ($TaSi_x$), titanium silicide ($TiSi_x$) and combinations thereof. A silicide layer may be formed in the trenches 373 by, for example, silicidation (e.g., formation of an alloy including a portion of a contact material with an underlying silicon layer), before filling the trenches 373 with a remainder of electrically conductive material. The contacts 317 may be self-aligned silicides or "salicides." The contacts 317 are formed in the trenches 373 on layers 325. According to an embodiment of the present invention, in addition to the silicides, the contacts 317 include a conductive metal, such as, for example, tungsten or cobalt. As described in connection with FIG. 12, the combined conductive metal trench-silicide contact stack is polished.

Figure 12:
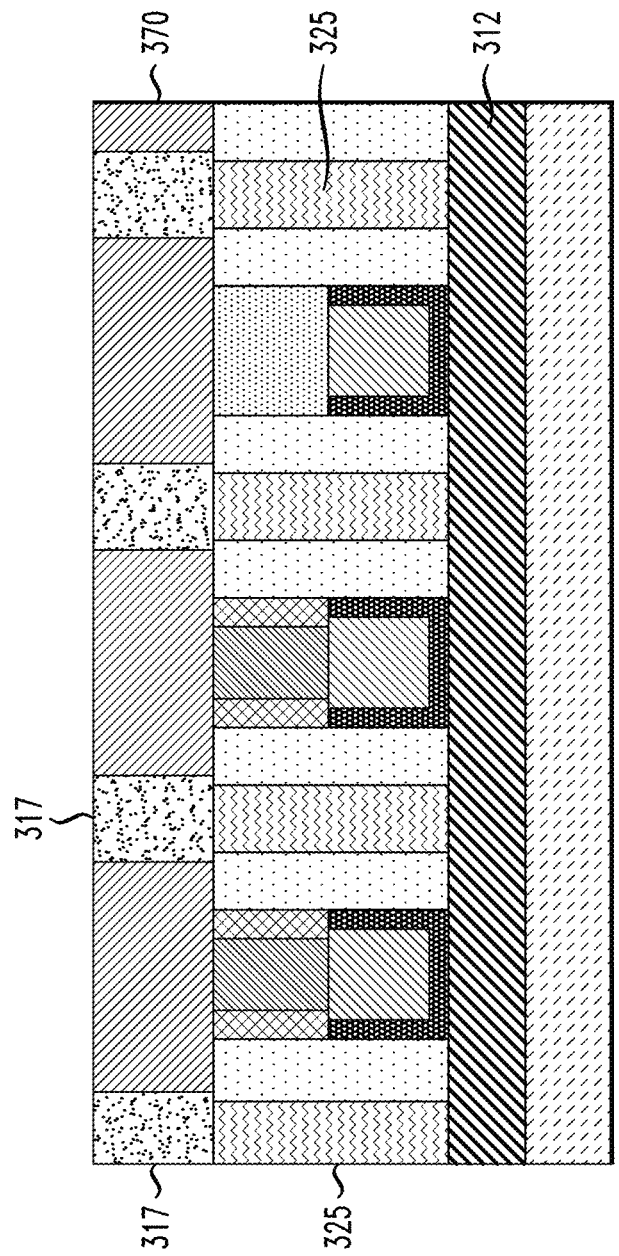
FIG. 12 is a schematic cross-sectional view illustrating manufacturing of a semiconductor device including gate contacts (CBs) over an active area (RX) and showing polishing to reduce a height of the ILD layer and trench silicide contacts, according to an embodiment of the invention.

FIG. 12 is a schematic cross-sectional view illustrating manufacturing of a semiconductor device including gate contacts (CBs) over an active area (RX) and showing polishing to reduce a height of the ILD layer and TS contacts, according to an embodiment of the invention. Referring to FIG. 12, after formation of the contacts 317, the structure is polished using, for example, CMP, to reduce a height of the ILD layer 370 and TS contacts 317. As can be understood from the following discussion in connection with FIGS. 13-21, and from the previous discussion in connection with FIGS. 1 and 2, the contacts 317 (also contacts 117, 217, 417, 517, 617 and 717) are partially strapped and/or offset and pulled back from the gate contacts (CB contacts) 318 (also contacts 118, 218, 418 and 718). In accordance with embodiments of the present invention, in some cases of device builds, the ILD layer 370 can be completely removed, and a structure where contacts like contacts 317 and 364 and gate cap dielectrics are all coplanar with each other.

Figure 13:
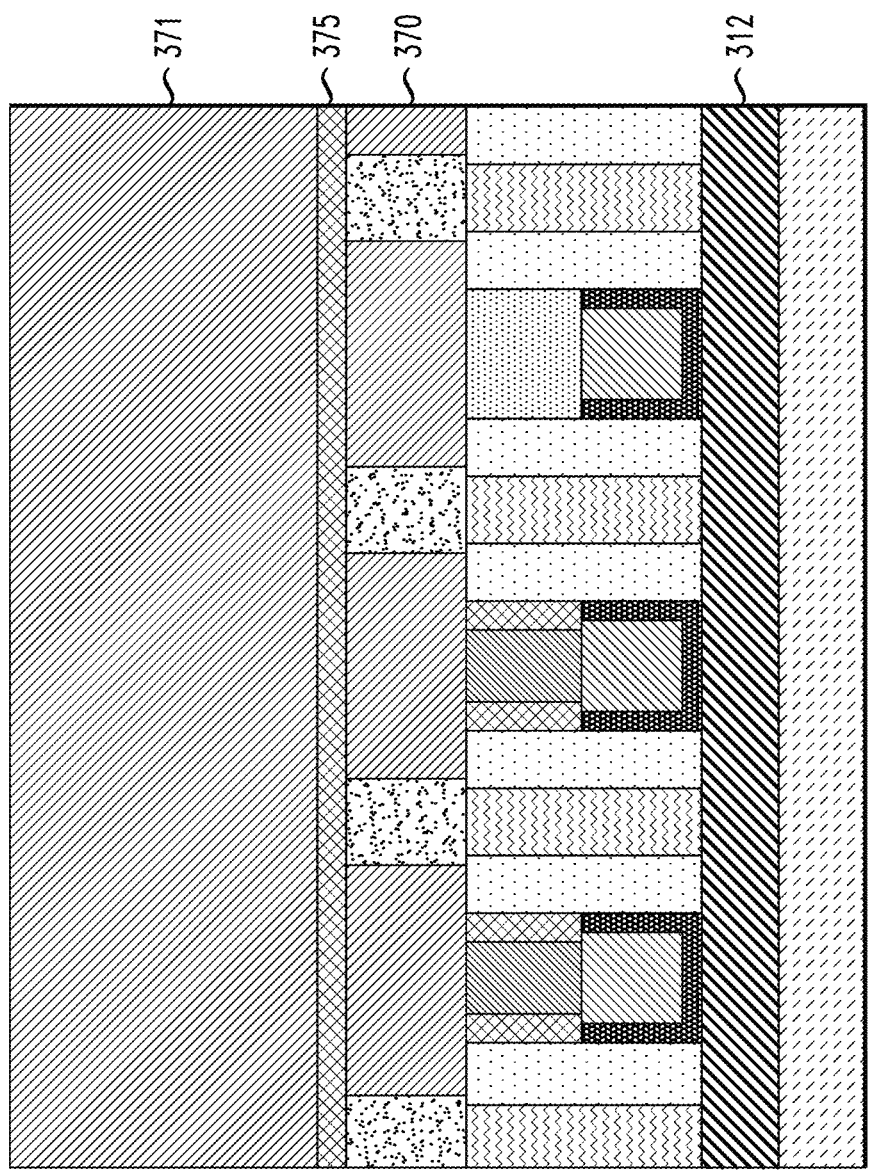
FIG. 13 is a schematic cross-sectional view illustrating manufacturing of a semiconductor device including gate contacts (CBs) over an active area (RX) and showing cap and ILD layer formation, according to an embodiment of the invention.

FIG. 13 is a schematic cross-sectional view illustrating manufacturing of a semiconductor device including gate contacts (CBs) over an active area (RX) and showing cap and ILD layer formation, according to an embodiment of the invention. Referring to FIG. 13, a cap layer 375 is formed on the resulting structure from FIG. 12, and can include, for example, a nitride, such as, but not necessarily limited to, SiN, SiON, SiOCN, or SiBCN. In addition, another inter-layer dielectric (ILD) layer 371 is deposited on the cap layer 375. The ILD layer 371 and cap layer 375 can be deposited using deposition techniques, including, but not limited to, CVD, PECVD, PVD, ALD, MBD, PLD, and/or liquid LSMCD. Like the ILD layer 370, the ILD layer 371 can include, but is not necessarily limited to, silicon dioxide (SiO$_2$), low-temperature oxide (LTO), high-temperature oxide (HTO), field oxide (FOX) or some other dielectric.

Figure 14:
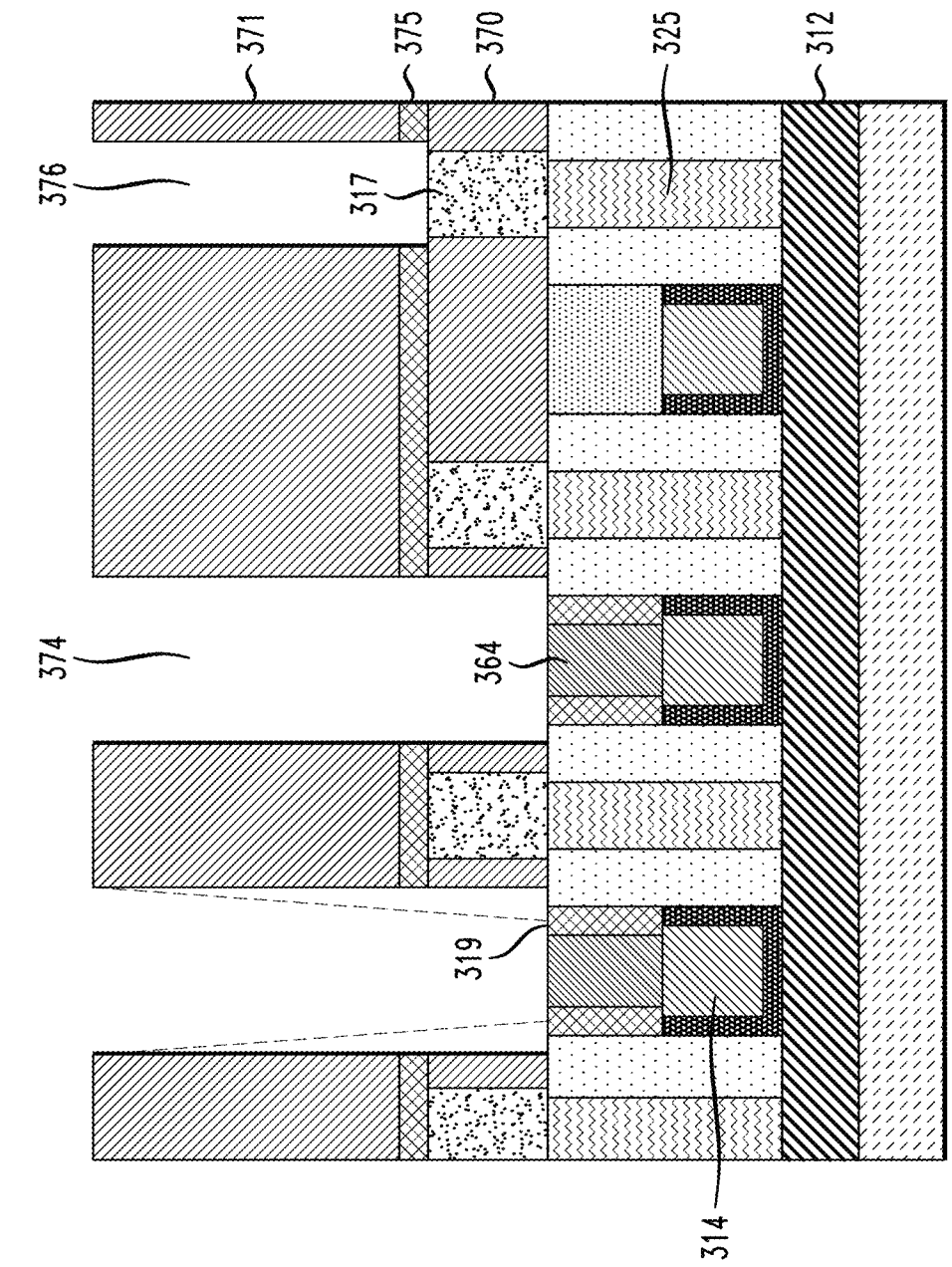
FIG. 14 is a schematic cross-sectional view illustrating manufacturing of a semiconductor device including gate contacts (CBs) over an active area (RX) and showing formation of openings exposing lower gate contacts (GC contacts) and a trench silicide contact, according to an embodiment of the invention.

FIG. 14 is a schematic cross-sectional view illustrating manufacturing of a semiconductor device including gate contacts (CBs) over an active area (RX) and showing formation of openings exposing lower gate contacts (GC contacts) and a trench silicide contact, according to an embodiment of the invention. Referring to FIG. 14, portions of the ILD layers 370 and 371 and cap layer 375 corresponding to the GC contacts 364 or to TS contacts 317 are removed to form openings 374, 376. The openings 374 expose the GC contacts 364 and opening 376 exposes TS contact 317. The openings 374 can be wide enough to expose the spacers 319 and portions of the gate spacers 315. The openings 374 and 376 can be formed using an etching process, such as, but not necessarily limited to, reactive ion etching (RIE). FIG. 14 illustrates rectangular openings 374. However, according to an embodiment, openings 374 can be tapered (as shown by dotted lines in FIG. 14) so that the opening is wider at the top of the opening, an decreases in size as it progresses toward a bottom of the opening 374 in order to further distance the CB contacts from the TS contacts.

Figure 15:
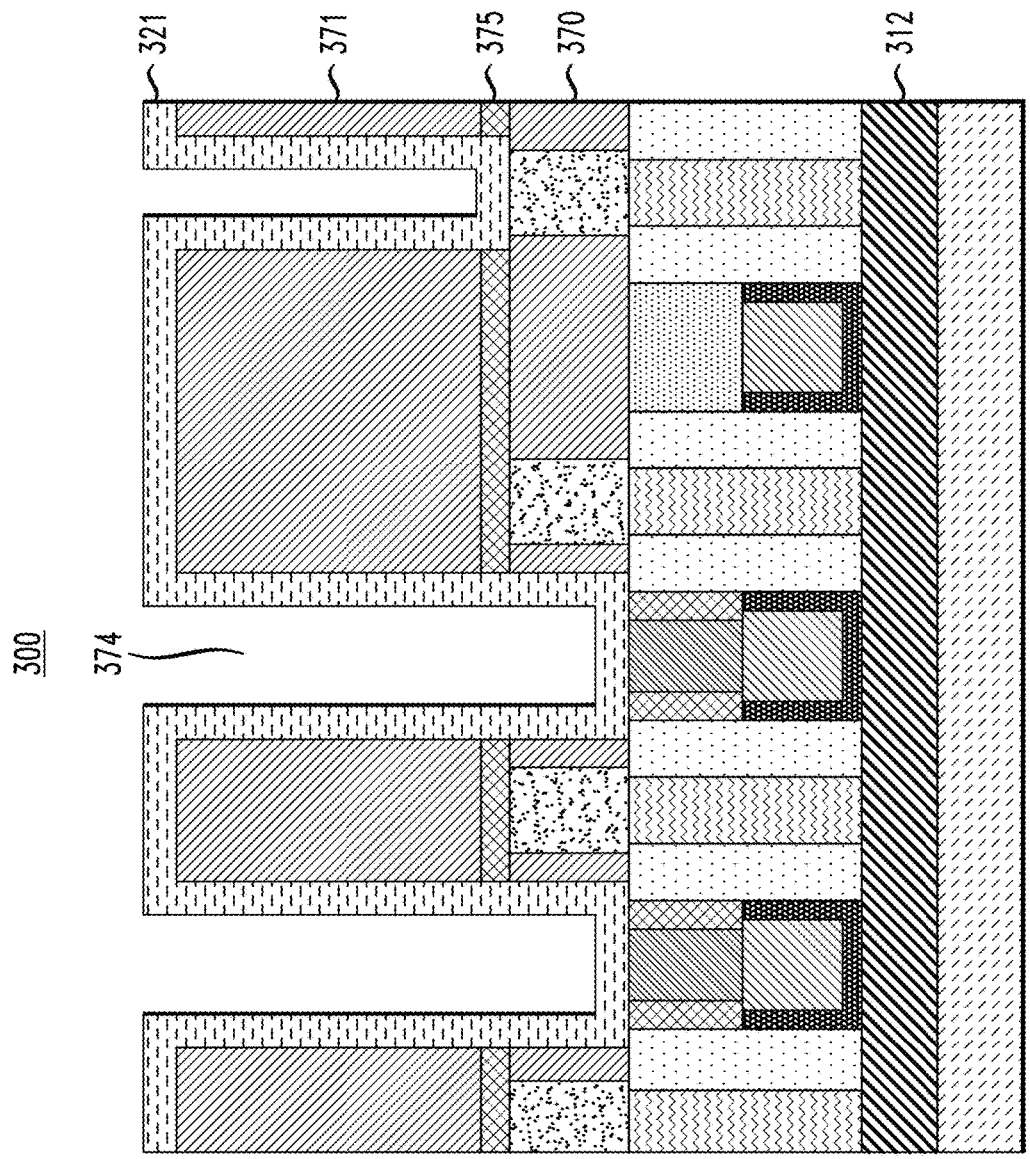
FIG. 15 is a schematic cross-sectional view illustrating manufacturing of a semiconductor device including gate contacts (CBs) over an active area (RX) and showing deposition of a second spacer layer, according to an embodiment of the invention.

FIG. 15 is a schematic cross-sectional view illustrating manufacturing of a semiconductor device including gate contacts (CBs) over an active area (RX) and showing deposition of a second spacer layer, according to an embodiment of the invention. Referring to FIG. 15, a second spacer layer 321 is deposited using deposition techniques, including, but not limited to, CVD, PECVD, PVD, ALD, MBD, PLD, and/or liquid LSMCD, followed by a spacer RIE to achieve a predetermined thickness of the spacer 321 on walls of the opening 374. In accordance with an embodiment of the present invention, the thickness of the spacer 321 can based on a CB to diffusion (e.g., trench silicide) contact reliability margin calculation and P-space calculations as discussed herein above.

The second spacer layer 321 can include, but is not necessarily limited to, a dielectric, such as silicon oxide, silicon nitride, silicon oxynitride, boron nitride, and/or silicon boron nitride. For example, in a non-limiting illustrative embodiment, a spacer layer 321 can be deposited on ILD layer 371 and conformally in openings 374 and 376 followed by RIE to result in a spacer 321 with a predetermined thickness on walls of openings 374 and 376.

Figure 16:
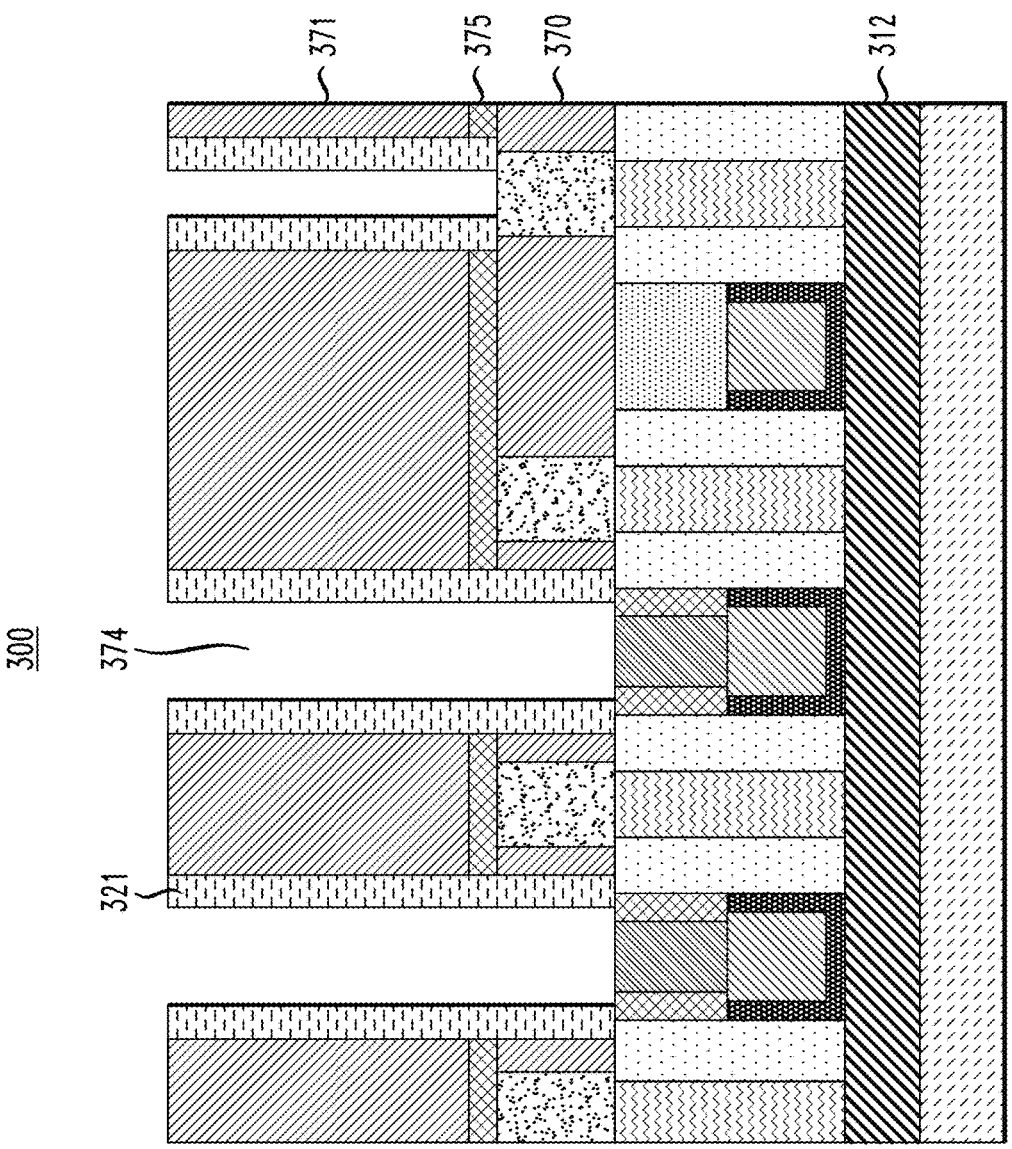
FIG. 16 is a schematic cross-sectional view illustrating manufacturing of a semiconductor device including gate contacts (CBs) over an active area (RX) and showing removal of portions of the second spacer layer, according to an embodiment of the invention.
Figure 17:
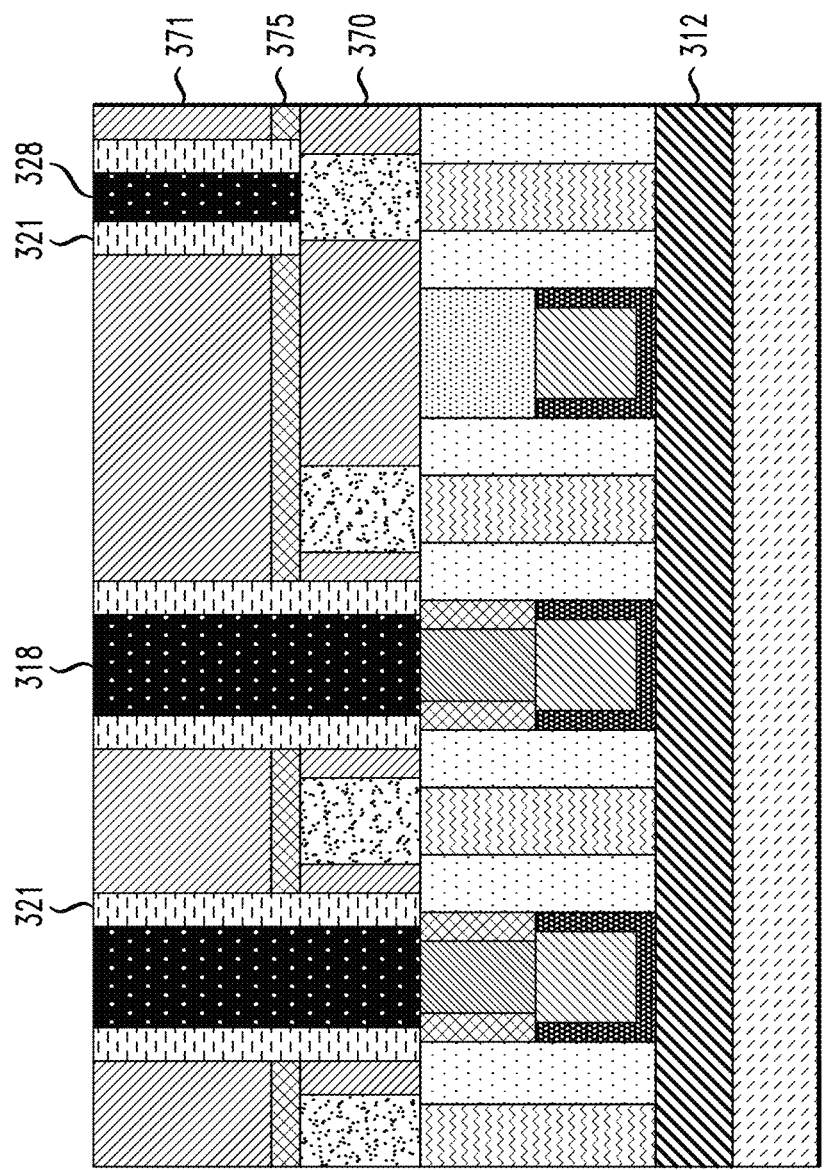
FIG. 17 is a schematic cross-sectional view illustrating manufacturing of a semiconductor device including gate contacts (CBs) over an active area (RX) and showing deposition of contact material, according to an embodiment of the invention.

FIG. 16 is a schematic cross-sectional view illustrating manufacturing of a semiconductor device including gate contacts (CBs) over an active area (RX) and showing removal of portions of the second spacer layer, according to an embodiment of the invention. Referring to FIG. 16, horizontal portions of the second spacer layer 321 are removed during the formation of the sidewall spacer 321. Then, referring to FIG. 17, contact material, such as, for example, an electrically conductive material including, but not necessarily limited to, titanium, titanium nitride, tungsten, cobalt, ruthenium, copper, or combinations thereof, is deposited in openings 374 and 376 on remaining portions of the spacer layer 321 to form a gate contact (CB contact) 318 in each of openings 374 and a contact 328 to the TS contact 317 ("CA contact"), which is a local interconnect line in electrical contact with the diffusion (e.g., trench silicide) contact. Deposition of the contact material can be performed using, for example, deposition techniques, CVD, PECVD, PVD, ALD, MBD, PLD, liquid LSMCD, sputtering and/or plating, followed by a planarization process, such as chemical mechanical polishing (CMP), which removes excess contact material.

Figure 18:
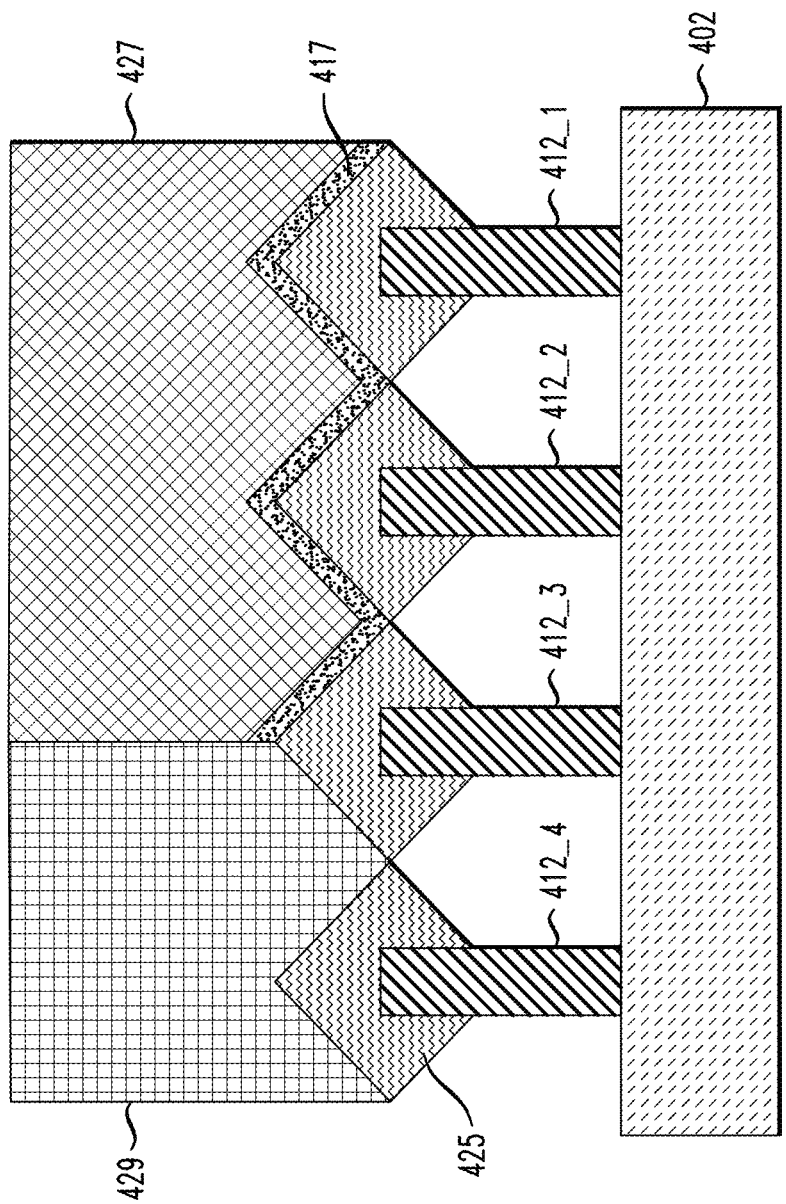
FIG. 18 is a schematic cross-sectional view illustrating manufacturing of a semiconductor device including gate contacts (CBs) over an active area (RX) and showing contact pull back on merged epitaxial regions where a fin is not strapped by a contact, according to an embodiment of the invention.

FIG. 18 is a schematic cross-sectional view a semiconductor device including gate contacts (CBs) over an active area (RX) and showing contact pull back on merged epitaxial regions where a fin is not strapped by a contact, according to an embodiment of the invention. Referring to FIG. 18, a plurality of fins 412_1, 412_2, 412_3 and 412_4 are formed on a substrate 402. Epitaxial regions 425 are grown on each of the fins 412_1-412_4 in the source/drain regions. For example, silicon germanium and/or silicon is epitaxially grown on exposed surfaces, for example silicon surfaces, of the fins 412_1-412_4. As can be seen in FIG. 18, growth is stopped after merging/contact between the epitaxial regions 425 from each fin 412_1-412_4 so that the fins 412_1-412_4 contact each other through the epitaxial regions 425. According to an embodiment the growth process is timed and stopped after a predetermined period to allow for merging.

To allow for CB contacts over an active region (RX) contact pull back is at fin 412_3 (n−1; here n=4 fins) so that the silicide does not extend to the fourth fin 412_4. Accordingly, a middle of line (MOL) contact 427 is in contact with fins 412_1-412_3 through the silicide 417, but does not reach fin 412_4, which remains isolated due to the lack of silicide 417 and the dielectric 429 (e.g., SiO$_2$ or some other dielectric) over the epitaxial region of fin 412_4 and part of the epitaxial region of fin 412_3. In other words, fin 412_4 is not strapped by a trench silicide contact. The silicide contacts 417 can be the same or similar to the contacts 317.

Figure 19:
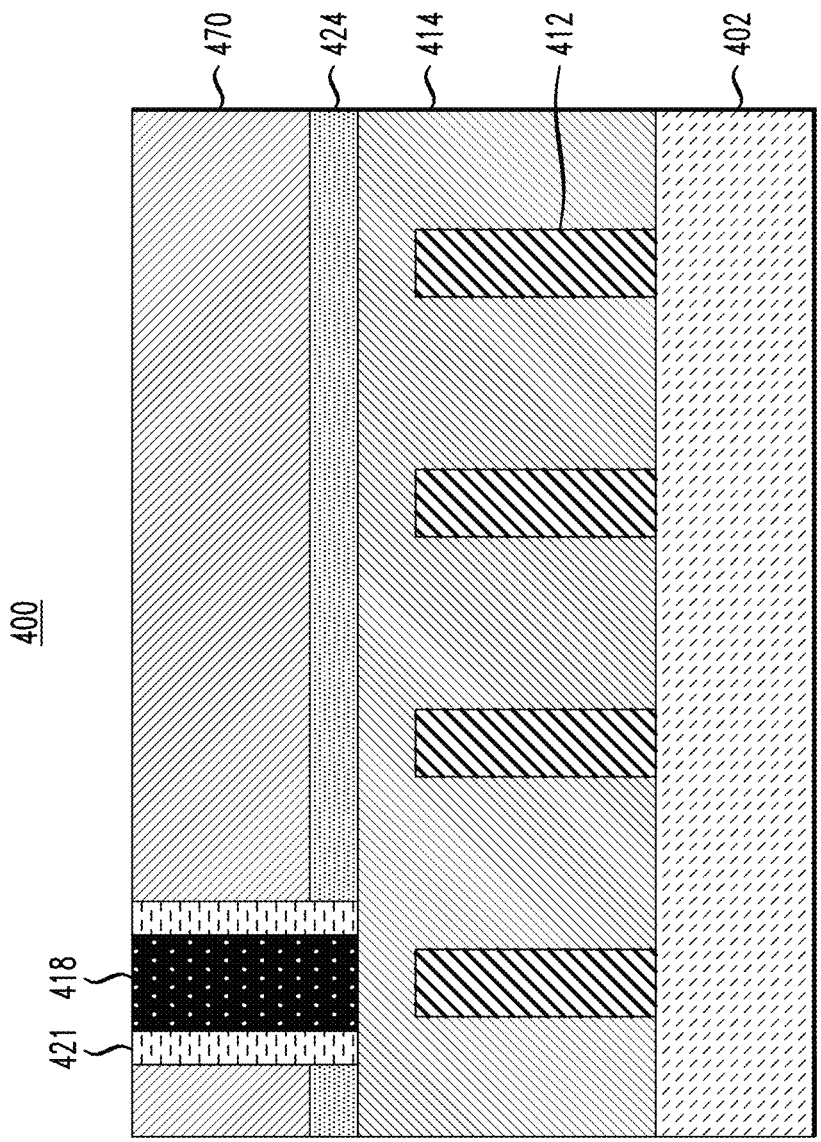
FIG. 19 is a schematic cross-sectional view illustrating manufacturing of a semiconductor device including gate contacts (CBs) over an active area (RX) and showing contact pull back on unmerged epitaxial regions where a fin is not strapped by a contact, according to an embodiment of the invention.

FIG. 19 is a schematic cross-sectional view illustrating a semiconductor device including gate contacts (CBs) over an active area (RX) and showing a gate contact with a spacer in a section through a gate region, according to an embodiment of the invention. Referring to FIG. 19, a gate 414 is formed around fins 412. A cap layer 424 is formed on the gate 414, and can include, for example, a nitride, such as, but not necessarily limited to, SiN, SiON, SiOCN, or SiBCN. Cap layer 424 can be the same or similar to cap layer 324 discussed herein above.

The CB contact 418, including a spacer 421 on sides thereof extends through where portions of the cap layer 424 have been removed to electrically contact gate 414. FIG. 19 further includes an inter-layer dielectric (ILD) layer 470 on the cap layer 424, which is the same or similar to layer 370 discussed herein above. The ILD layer 470 can be deposited using deposition techniques, including, but not limited to, CVD, PECVD, PVD, ALD, MBD, PLD, and/or liquid LSMCD. The ILD layer 470 can include, but is not necessarily limited to, silicon dioxide (SiO$_2$), low-temperature oxide (LTO), high-temperature oxide (HTO), field oxide (FOX) or some other dielectric.

Figure 20:
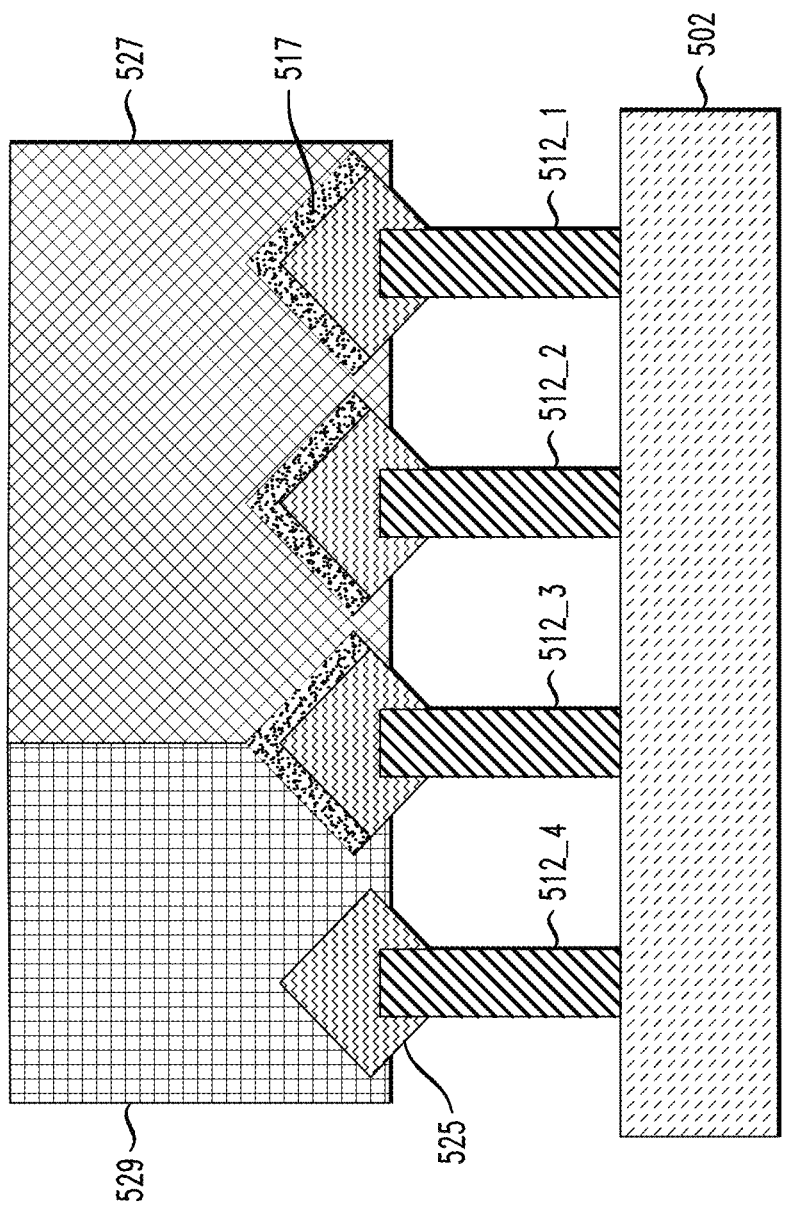
FIG. 20 is a schematic cross-sectional view illustrating manufacturing of a semiconductor device including gate contacts (CBs) over an active area (RX) and showing contact pull back on unmerged epitaxial regions where a fin is not strapped by a contact, according to an embodiment of the invention.

FIG. 20 is a schematic cross-sectional view illustrating a semiconductor device including gate contacts (CBs) over an active area (RX) and showing contact pull back on unmerged epitaxial regions where a fin is not strapped by a contact, according to an embodiment of the invention. Referring to FIG. 20, a plurality of fins 512_1, 512_2, 512_3 and 512_4 are formed on a substrate 502. Epitaxial regions 525 are grown on each of the fins 512_1-512_4 in the source/drain regions. For example, silicon germanium and/or silicon is epitaxially grown on exposed surfaces, for example silicon surfaces, of the fins 512_1-512_4. As can be seen in FIG. 20, growth is stopped prior to merging of the epitaxial regions 525 from each fin 512_1-512_4 so that the fins 512_1-512_4 do not contact each other through the epitaxial regions 525. Referring to FIG. 20, spaces/separations are present between the epitaxial region 525 of a fin 512 and the epitaxial regions 525 of adjacent fins 512. According to an embodiment the growth process is timed and stopped after a predetermined period to avoid merging.

To allow for CB contacts over an active region (RX) contact pull back is at fin 512_3 (n−1; here n=4 fins) so that the silicide does not extend to the fourth fin 512_4. Accordingly, a middle of line (MOL) contact 527 is in contact with fins 512_1-512_3 through the silicide 517 on each epitaxial region 525, but does not reach fin 512_4, which remains isolated due to the lack of silicide 517 on the epitaxial region of fin 512_4 and the dielectric 529 (e.g., SiO$_2$ or some other dielectric) over the epitaxial region of fin 512_4 and part of the epitaxial region of fin 512_3. In other words, fin 512_4 is not strapped by a trench silicide contact. The silicide contacts 517 can be the same or similar to the contacts 317.

Figure 21:
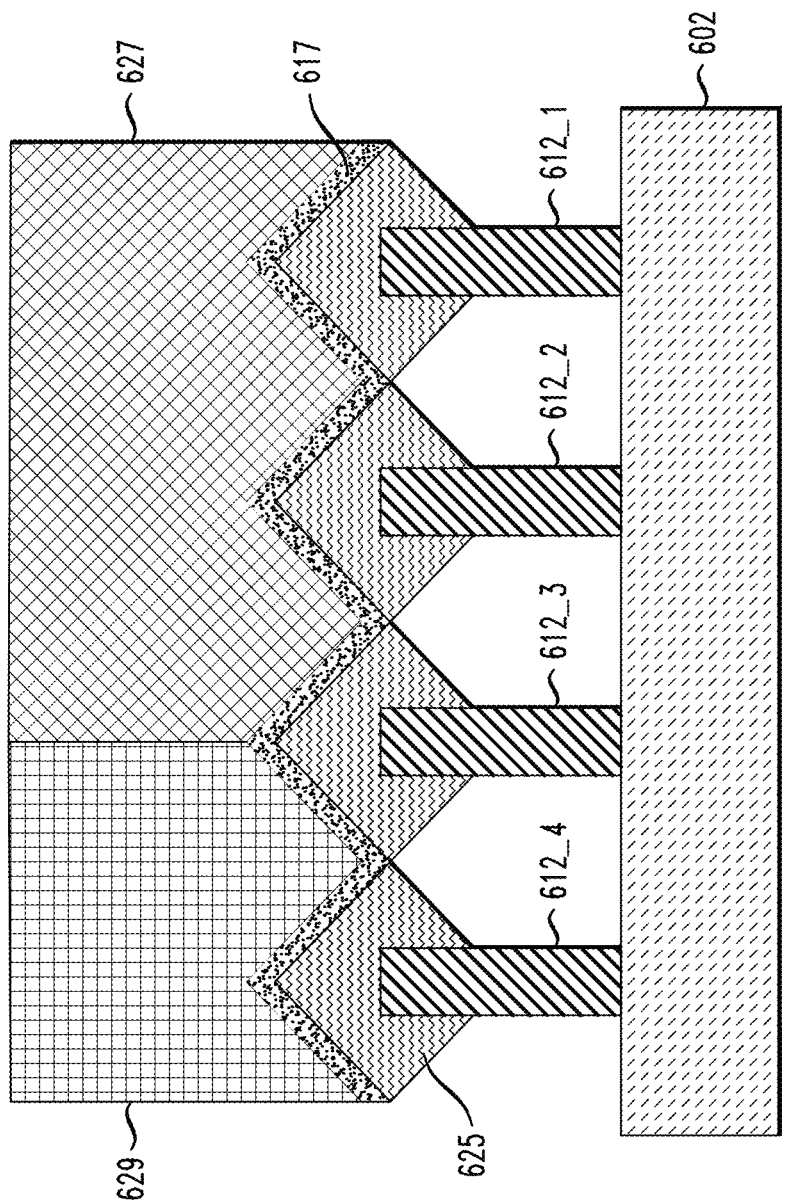
FIG. 21 is a schematic cross-sectional view illustrating manufacturing of a semiconductor device including gate contacts (CBs) over an active area (RX) and showing contact strapping of merged epitaxial regions where a contact is understrapped to a fin, according to an embodiment of the invention.

FIG. 21 is a schematic cross-sectional view illustrating manufacturing of a semiconductor device including gate contacts (CBs) over an active area (RX) and showing contact strapping of merged epitaxial regions where a contact is understrapped to a fin, according to an embodiment of the invention. Referring to FIG. 21, a plurality of fins 612_1, 612_2, 612_3 and 612_4 are formed on a substrate 602. Epitaxial regions 625 are grown on each of the fins 612_1-612_4 in the source/drain regions. For example, silicon germanium and/or silicon is epitaxially grown on exposed surfaces, for example silicon surfaces, of the fins 612_1-612_4. As can be seen in FIG. 21, growth is stopped after merging/contact between the epitaxial regions 625 from each fin 612_1-612_4 so that the fins 612_1-612_4 contact each other through the epitaxial regions 625. According to an embodiment the growth process is timed and stopped after a predetermined period to allow for merging.

A salicide contact 617 is on the epitaxial region 625 of each fin 612_1-612_4. To allow for CB contacts over an active region (RX). In accordance with an embodiment of the present invention, when the salicide contact 617 is formed to strap the fins 612_1-612_4, the dielectric 629 is deposited and the structure is returned to same state without the salicide. At this point, in order to enable CB contacts over an active region (RX), contact metallization is performed over the fins 612_1-612_3, and not over fin 612_4 to provide physical spacing between TS and gate contacts. The isolation of the fin (e.g., fin 612_4) as discussed above, will not occur in this embodiment since the salicide contact 617 is on the epitaxial region 625 of each fin 612_1-612_4. The physical height separation by about the height of the metal gate and the pull back of TS contact prevents electrical shorting of gate to source-drain TS contacts.

A middle of line (MOL) contact 427 is in contact with fins 612_1-612_3, but does not reach fin 612_4, due to the trench contact being understrapped as explained above, and the dielectric 629 (e.g., SiO$_2$ or some other dielectric) over the epitaxial region of fin 612_4 and part of the epitaxial region of fin 612_3. The salicide contacts 617 can be the same or similar to the contacts 317. Depending the type of epitaxial growth and silicide strapping, device models capture the performance of the layout.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:
1. A method for manufacturing a semiconductor device, comprising:
   forming a plurality of fins in an active region;
   forming a plurality of gates around the plurality of fins in the active region;
   forming one or more gate contacts in the active region; and
   forming a plurality of trench silicide contacts to source/drain regions in the active region;
   wherein one or more of the plurality of trench silicide contacts are formed over less than the number of the plurality of fins in the active region; and
   wherein the one or more gate contacts overlap one or more fins of the plurality of fins in the active region lacking a trench silicide contact formed thereon.
2. The method according to claim 1, further comprising:
   positioning the one or more of the plurality of trench silicide contacts at a predetermined distance away from the one or more gate contacts;
   wherein the predetermined distance is determined based on a calculation to avoid shorting between the one or more gate contacts and the one or more of the plurality of contacts.

3. The method according to claim 1, further comprising:

forming respective epitaxial regions on the plurality of fins;

forming the one or more of the plurality of trench silicide contacts on the respective epitaxial regions of less than the number of the plurality of fins.

4. The method according to claim 1, further comprising electrically isolating at least one fin of the plurality of fins from the one or more of the plurality of trench silicide contacts.

5. The method according to claim 4, wherein the electrically isolating comprises:

forming a dielectric layer on an epitaxial region extending from the at least one fin.

6. The method according to claim 1, further comprising respectively positioning one or more spacers on the one or more gate contacts between the one or more gate contacts and the one or more of the plurality of trench silicide contacts.

7. The method according to claim 1, further comprising respectively positioning one or more spacers on the one or more gate contacts.

8. A method for manufacturing a semiconductor device, comprising:

forming a plurality of fins in an active region;

forming respective epitaxial regions on the plurality of fins;

forming one or more gate contacts in the active region; and forming a trench silicide contact in the active region on the respective epitaxial regions of less than a number of the plurality of fins;

wherein the one or more gate contacts overlap one or more fins of the plurality of fins in the active region lacking the trench silicide contact formed thereon.

9. The method according to claim 8, further comprising respectively positioning one or more spacers on the one or more gate contacts between the one or more gate contacts and the trench silicide contact.

\* \* \* \* \*